United States Patent [19]
Wu

[11] Patent Number: 6,074,932
[45] Date of Patent: Jun. 13, 2000

[54] METHOD FOR FORMING A STRESS-FREE SHALLOW TRENCH ISOLATION

[75] Inventor: Shye-Lin Wu, Hsinchu, Taiwan

[73] Assignee: Texas Instruments - Acer Incorporated, Hsinchu, Taiwan

[21] Appl. No.: 09/014,866

[22] Filed: Jan. 28, 1998

[51] Int. Cl.[7] .................................................. H01L 21/76
[52] U.S. Cl. .......................... 438/435; 438/424; 438/437; 438/296; 438/446
[58] Field of Search .................................. 438/424, 425, 438/435, 437, 296, 445, 446

[56] References Cited

U.S. PATENT DOCUMENTS

| | | | |
|---|---|---|---|
| 5,521,422 | 5/1996 | Mandelman et al. | |
| 5,658,822 | 8/1997 | Wu | 438/446 |
| 5,679,599 | 10/1997 | Mehta | 438/425 |
| 5,679,601 | 10/1997 | Wu | 438/446 |
| 5,801,083 | 9/1998 | Yu et al. | 438/435 |
| 5,863,827 | 1/1999 | Joyner | 438/424 |
| 5,910,018 | 6/1999 | Jang | 438/425 |

OTHER PUBLICATIONS

Andres Bryant et al., *Characteristics of CMOS Device Isolation for the ULSI Age*, 1994 IEEE, pp. 671–674.
S.E. Kim et al., *Nitride Cladded Poly–Si Spacer LOCOS (NCPSL) Isolation Technology for the 1 Giga Bit DRAM*, 1996 IEEE, pp. 825–828.
Pierre C. Fazan et al., *A Highly Manufacturable Trench Isolation Process for Deep Submicron DRAMs*, 1993 IEEE, pp. 57–60.

*Primary Examiner*—Trung Dang
*Attorney, Agent, or Firm*—Harness, Dickey & Pierce, P.L.C.

[57] ABSTRACT

The method for forming a trench isolation includes the steps as follows. At first, a first pad layer is formed over the semiconductor substrate and a stacked layer is formed over the first pad layer. An opening is then defined in the first pad layer and the stacked layer. A portion of the first pad layer is removed to have an undercut region under the stacked layer. A second pad layer is formed on an exposed portion of the semiconductor substrate under the opening and the undercut region. Then a buffer layer within the undercut region and a sidewall structure on the stacked layer are formed. A portion of the second pad layer uncovered by the sidewall structure is removed. A portion of the semiconductor substrate uncovered by the stacked layer and the second pad layer is then removed to form a trench. A first insulator layer is formed over the trench and within the undercut region. Thus a trench structure with a first insulator layer can be formed.

22 Claims, 3 Drawing Sheets

METHOD FOR FORMING A STRESS-FREE SHALLOW TRENCH ISOLATION

FIELD OF THE INVENTION

The present invention relates to a semiconductor manufacturing process, and more specifically to a method of forming a trench isolation. A stress-free shallow trench isolation can be formed by the method of the present invention.

BACKGROUND OF THE INVENTION

In the integrated circuits, a great number of devices and circuits are fabricated on a single chips. Various kinds of devices like transistors, resistors, and capacitors are formed together. Each device must operate independently without interfering each other, especially under the higher and higher packing density of the integrated circuits. An isolation region is formed on the semiconductor substrate for separating different devices or different functional regions. The isolation region is generally a non-active and insulated region for isolating between devices, wells for transistors, and functional regions.

LOCOS (local oxidation of silicon) is a widely applied technology in forming the isolation region. The isolation regions are created by oxidizing the portion of the silicon substrate between each active devices and functional regions. The LOCOS technology provide the isolation region with a simple manufacturing process and low cost, especially when compared with other trench isolation processes. However, with the fabrication of semiconductor integrated circuits becomes densely packed, the application of the LOCOS technology is quite limited. For a highly packed circuits like the circuits with devices of deep sub-micrometer feature sizes, the LOCOS process has several challenges in fulfilling the isolating specifications.

The trench isolation process, or the shallow trench isolation (STI) process, is another isolation process proposed especially for semiconductor chips with high integration. A trench region is formed in the semiconductor with a depth deep enough for isolating the devices or different wells. In general, a trench is etched and refilled with insulating materials in the trench isolation process. The refilled trench regions are developed for the application in the VLSI and ULSI level. In addition, capacitors can also be formed within the trench by filling both insulating and conductive materials sequentially for the application of forming memory cells.

The conventional LOCOS isolation process suffers the problems like large bird's beak, local field oxide thinning effect, and stress-induced silicon defects. In the article of "Characteristics of CMOS Device Isolation for the ULSI Age" by A. Bryant et al. (in IEDM Tech. Dig., p. 671, 1994), different isolation processes are investigated. They reviewed how LOCOS and STI isolation are being improved to meet the scaling requirements. The scalability of LOCOS for sub-half-micrometer CMOS technologies is a widely identified question. The issues like lateral extent of the LOCOS bird's beak, non-planarity, thinning, and stress-induced silicon defects are addressed in their work. It is concluded that future CMOS technology will require an effective device isolation method that provides abrupt transitions to active device regions with a minimum impact on device characteristics or topography.

At 1996, S. E. Kim et al. disclosed a LOCOS technology in the work "Nitride Cladded Ploy-Si Spacer LOCOS (NCPSL) Isolation Technology for the 1 Giga Bit DRAM" (in IEDM Tech. Dig., p. 825, 1996). The limitation of the conventional LOCOS technology with the scaling down of the devices is illustrated. Fully recessed LOCOS is one solution to the problem. However, simply recessing the field regions before field oxidation brings about excessive bird's beak penetration. They merged the concept of RPSL (Recessed Poly-Si Spacer LOCOS) and RNSL (Recessed Nitride Spacer LOCOS) to reduce the bird's beak length while maintaining the smooth edge profile by employing selective SiN deposition on poly-Si spacer.

Although with better isolating characteristics than the LOCOS process, the trench isolation process is suffered from a large defects induced by dry etching and sharp trench corner effects. In the work of P. C. Fazan and V. K. Mathews ("A Highly Manufacturable Trench Isolation Process for Deep Submicron DRAMs", in IEDM Tech. Dig., p. 57, 1993), the replacement of the LOCOS-based isolation schemes with the STI process is disclosed. STI provides a planar surface and a fully recessed field oxide, does not suffer from field oxide thinning, and can easily be scaled down for 1 to 4 Gb DRAM applications. However, STI also requires a much more complicated planarization procedure and carries the devices reverse narrow width effects. A trench isolation process combining tapered trench sidewalls, a trench reoxidation, a vertical B field implant, a CMP-only planarization, and disposable spacers to smooth the trench corners, is proposed in the work.

For solving the trench corner effects, a lot of methods and structures are developed. U.S. Pat. No. 5,521,422 to J. A. Mandelman is an example. In the work "Corner Protected Shallow Trench Isolation Device", a semiconductor structure to prevent gate wrap-around and corner parasitic leakage is proposed. A sidewall structure around the trench region is formed to solve the problems induced in the planarization process. The problems of the corner leakage and the recessed isolation insulator adjacent the corner is solved by the structure in their work with the additional sidewall structure.

SUMMARY OF THE INVENTION

A method of forming a trench isolation is disclosed in the present invention. A stress-free shallow trench isolation can be formed for the application with a wide variety of feature sizes, like the deep sub-micrometer or smaller CMOS applications. The conventional LOCOS isolation can be replaced with the method in providing improved trench isolation. The etching-induced defects and corner effect in damaging the threshold voltage of active devices can be solved. A buffer layer within an undercut region can be formed as a source to form the first insulator layer. The bird's beak and the oxidation-induced stress can be minimized. The dry etching induced damages and the sharp trench corner effect can be greatly reduced.

The method for forming a trench isolation includes the steps as follows. At first, a first pad layer is formed over the semiconductor substrate and a stacked layer is formed over the first pad layer. An opening to the semiconductor substrate is then defined in the first pad layer and the stacked layer. A portion of the first pad layer is removed to have an undercut region under the stacked layer around the opening. A second pad layer is formed on an exposed portion of the semiconductor substrate under the opening and the undercut region. Then a buffer layer within the undercut region and a sidewall structure on the stacked layer are formed. A portion of the second pad layer uncovered by the sidewall structure is removed. A portion of the semiconductor substrate uncovered by the stacked layer and the second pad layer is then removed to form a trench. A first insulator layer is formed over the trench and within the undercut region. Thus a trench structure with a first insulator layer can be formed.

In addition, four more steps can be added to fill the trench and planarized the semiconductor substrate for the formation of active devices. A second insulator layer can be formed within the trench and over the stacked layer. A thermal process is then performed to concentrate the second insulator layer. A portion of the second insulator layer not located over the trench is removed and the stacked layer and the pad layer are also removed finally.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention propose a method to form a stress-free shallow trench isolation. A buffer layer is formed in an undercut structure during the trench process. An insulator layer can be formed from the buffer layer with less stress induced to the semiconductor substrate. The minimization of the bird's beak and the oxidation-induced stress can be achieved. With the protection of a sidewall structure, the dry etching induced damages near the active area can be largely reduced. A rounded trench corner is provided to relieve the sharp trench corner effect. The method for forming a stress-free shallow trench isolation is described as following.

Figure 1:
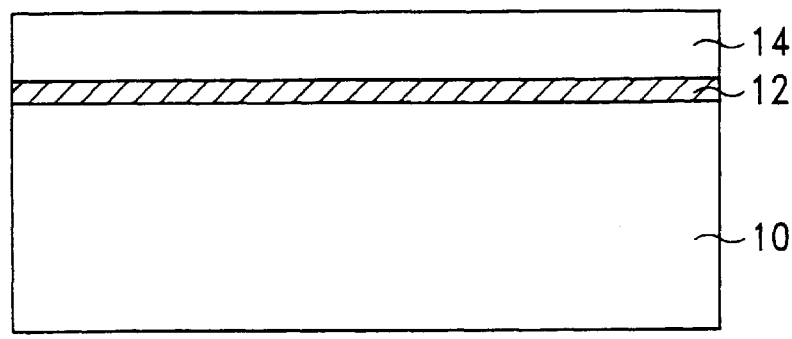
FIG. 1 illustrates a cross sectional view of forming a first pad layer and a stacked layer on the semiconductor substrate in the present invention.
Figure 2:
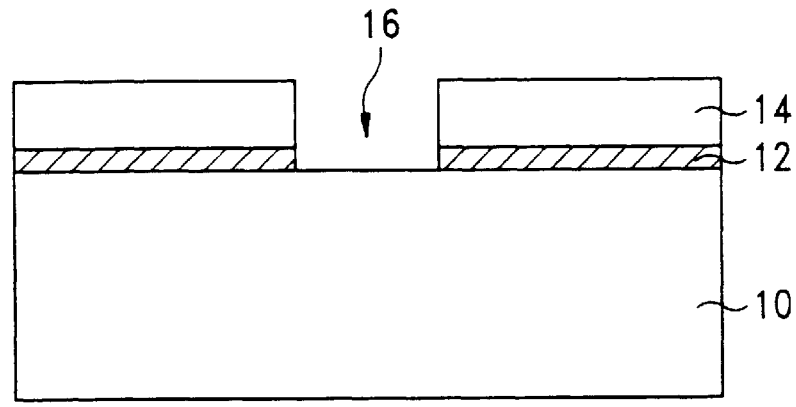
FIG. 2 illustrates a cross sectional view of defining an opening in the first pad layer and the stacked layer in the present invention.

Referring to FIG. 1, a semiconductor substrate 10 is provided for forming isolation region and the active devices. In general, a silicon substrate with a preferable single crystalline silicon in a <100> direction can be used. A first pad layer 12 is formed over the semiconductor substrate 10. An example of first pad layer 12 is an oxide layer which is grown thermally from the semiconductor substrate 10 in an oxygen containing ambient. The thickness of the oxide layer can be about 150 angstroms to about 1000 angstroms. The pad oxide layer 12 is employed to relieve the stress of a stacked layer formed layer. Thus the thermal induced stress from the difference of thermal expansion characteristics can be relived. A stacked layer 14 is then formed over the first pad layer 12. The combination of the stacked layer 14 and the first pad layer 12 serves as a masking layer for defining the active region. In the case, a chemical vapor deposited nitride layer is employed as the stacked layer 14.

An opening 16 is then defined to the semiconductor substrate 10 in the first pad layer 12 and the stacked layer 14. The opening 16 defines the approximate trench region and the exact trench region can be adjusted in later steps. The region cover by the first pad layer 12 and the stacked layer 14 are utilized to form active devices. Generally speaking, the opening 16 can be defined with a lithography process and an etching process. The lithography process transfers a desired pattern on a mask to a photoresist layer over the stacked layer 14. The etching process like a reactive ion etching (RIE) process can be employed to etch the stacked layer 14 and the first pad layer 12 anisotropically. A wide range of the width can be defined with different specifications and feature sizes. For circuits with high integrity, a minimum width under the limitation of the lithography technology can be defined.

Figure 3:
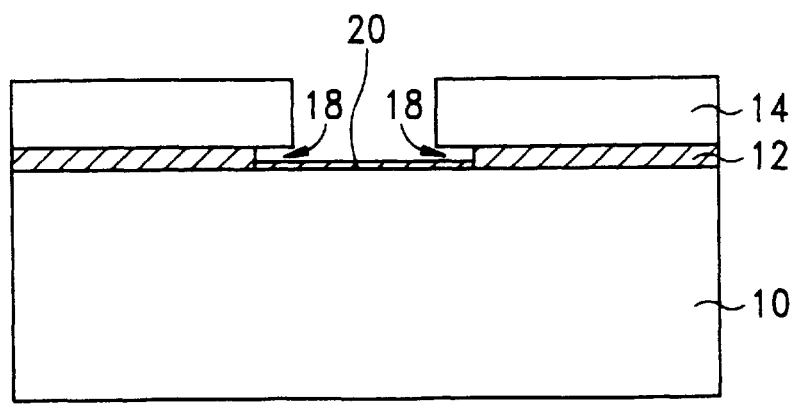
FIG. 3 illustrates a cross sectional view of forming an undercut region and a second pad layer on the semiconductor substrate in the present invention.

Referring to FIG. 3, a portion of the first pad layer 12 under the stacked layer 14 is removed to have an undercut region 18. In the present embodiment, an undercut width of about 200 angstroms to 1500 angstroms at each side can be formed, although no limitation on the undercut width shall be applied. An isotropic etching process, like a short dip in a diluted hydrofluoric acid, can be used. Other isotropic etching process which is well known in the art can be applied alternatively. A second pad layer 20 is formed on an exposed portion of the semiconductor substrate 10, under the opening 16 and the undercut region 18. In the case, the second pad layer 20 is a thin oxide layer which is grown thermally from the semiconductor substrate 10 in an oxygen containing ambient, with a thickness between about 10 angstroms to about 250 angstroms. The regrowth of the thin oxide layer recovers the etching damage on the surface of the semiconductor substrate 10 around the opening 16, which is formed in the previous RIE process. Thus the damage near the boundary of the trench and the active devices can be greatly reduced especially at the critical corner area.

Figure 4:
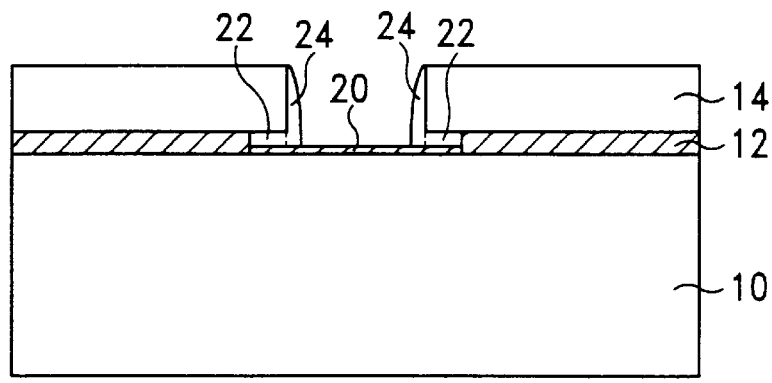
FIG. 4 illustrates a cross sectional view of forming a buffer layer within the undercut region and a sidewall structure on the stacked layer in the present invention.

A buffer layer 22 within the undercut region 18 and a sidewall structure 24 on the stacked layer 14 are then formed, as shown in FIG. 4. In general, the buffer layer 22 and the sidewall structure 24 can be formed simultaneously. In the preferred embodiment, a process of depositing and etching back a silicon layer is employed. An amorphous silicon layer or a polysilicon layer can be formed with high conformability to fill within the undercut region 18. A chemical vapor deposition (CVD) process of silicon is utilized in the case. A dry etching process like a RIE process can be applied in etching back to form the undercut region 18 and the sidewall structure 24 at the same time. The second pad layer 20 serves as an etch stop in the etching process to prevent the etching to the semiconductor substrate 10. The formation of sidewall structure 24 in the opening 16 can further adjust the width of the trench region. An accurate and narrowed trench size can be defined exactly without being limited to the minimum width defined under the limitation of the lithography process.

Figure 5:
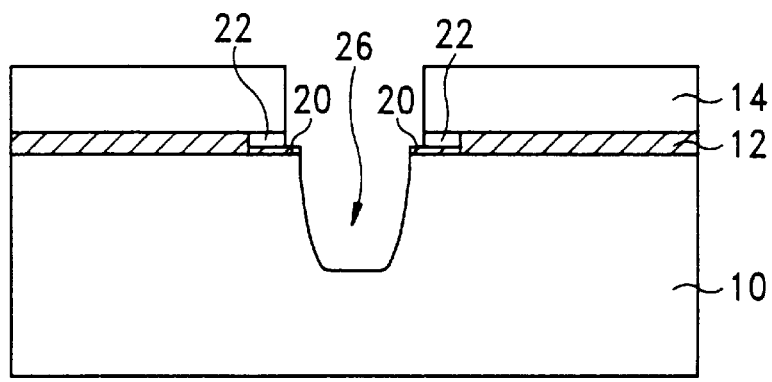
FIG. 5 illustrates a cross sectional view of removing a portion of the semiconductor substrate to form a trench in the present invention.

A portion of the second pad layer 20 uncovered by the sidewall structure 24 is removed and the trench size is defined onto the second pad layer 20, as shown in FIG. 5. A portion of the semiconductor substrate 10 uncovered by the stacked layer 14 and the second pad layer 20 is then removed to form a trench 26. An etching process have a high etching selectivity between silicon and oxide is applied. A dry etching process like a RIE process is used. The second pad layer 20 with a defined narrower opening is utilized as an etching mask in the process. The sidewall structure 24 which have the same material with the semiconductor substrate 10 is also removed in the process. The dry etching induced damages near the active area of the semiconductor substrate 10 can be reduced by the protection of sacrificing the sidewall structure 24 during the process. The buffer layer 22 is kept in the undercut region 18 with the masking of the stacked layer 14 located above.

Figure 6:
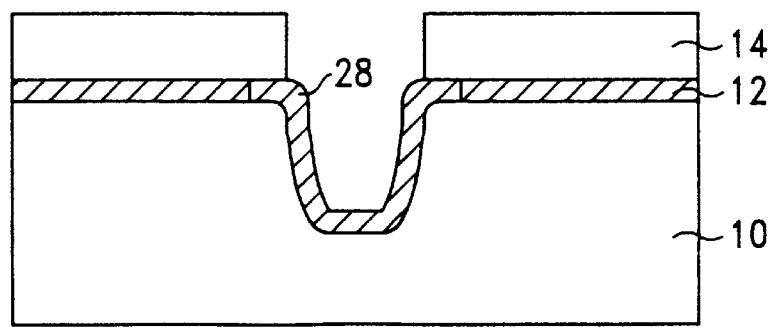
FIG. 6 illustrates a cross sectional view of forming a first insulator layer over the trench and within the undercut region in the present invention.

Referring to FIG. 6, a first insulator layer 28 is formed on the top surface of the trench 26 and within the undercut region 22. The first insulator layer 28 is formed by growing from the semiconductor substrate 10 and the buffer layer 22 to form insulating products. An high temperature oxidation process is performed in the preferred embodiment to form an oxide layer as the insulator layer 28, with a temperature of about 800° C. to about 1100° C. The reactants of the oxidation process comes from not only the semiconductor substrate 10 and also the buffer layer 22. Thus a well rounded and thick first insulator layer 28 as shown in FIG. 6 can be formed. The surface damage of the trench 26 under etching can be removed by growing the oxide layer. The sharp trench corner in the conventional trench isolation process can be avoided. With the buffer layer 22 as an oxidation source, a minimized bird's beak and reduced oxidation-induced stress can be achieved.

Figure 7:
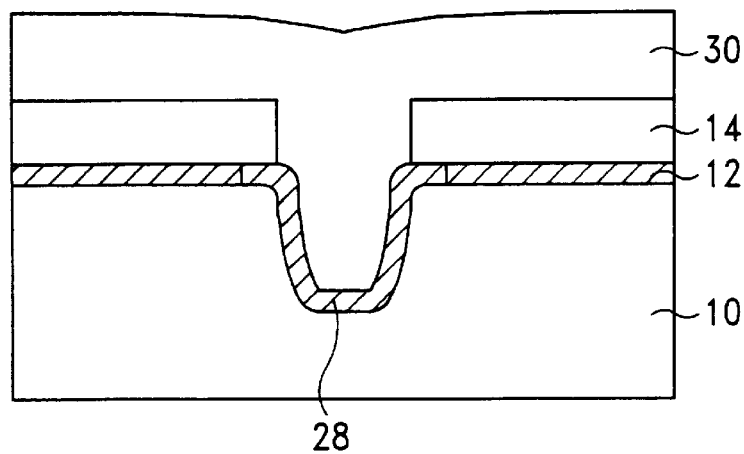
FIG. 7 illustrates a cross sectional view of forming a second insulator layer within the trench and over the stacked layer in the present invention.

With the above identified process, a trench structure with a first insulator layer 28 can be formed. Four more steps can be optionally added to fill the trench and planarized the semiconductor substrate 10 for the formation of active devices. As shown in FIG. 7, a second insulator layer 30 is formed within the trench 26 and over the stacked layer 14. An oxide layer deposited with a LPCVD (low pressure CVD), TEOS CVD (tetra-ethyl-ortho-silicate), PECVD (plasma-enhanced CVD), or HDPCVD (high density plasma CVD) can be used. A thermal process is then performed to concentrate the CVD oxide layer. A high temperature $O_2$ annealing process is applied in the embodiment.

Figure 8:
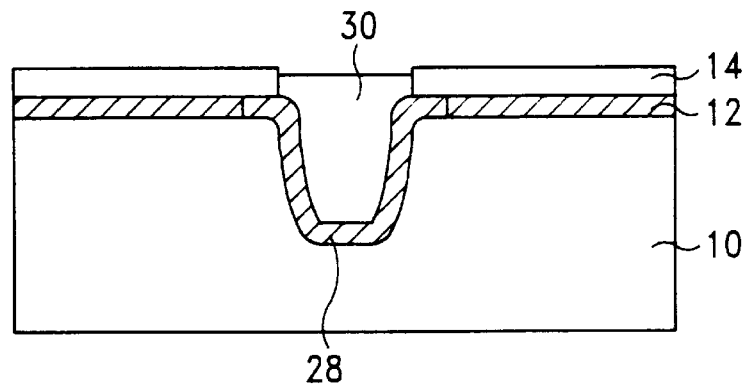
FIG. 8 illustrates a cross sectional view of removing a portion of the second insulator layer not located over the trench in the present invention.
Figure 9:
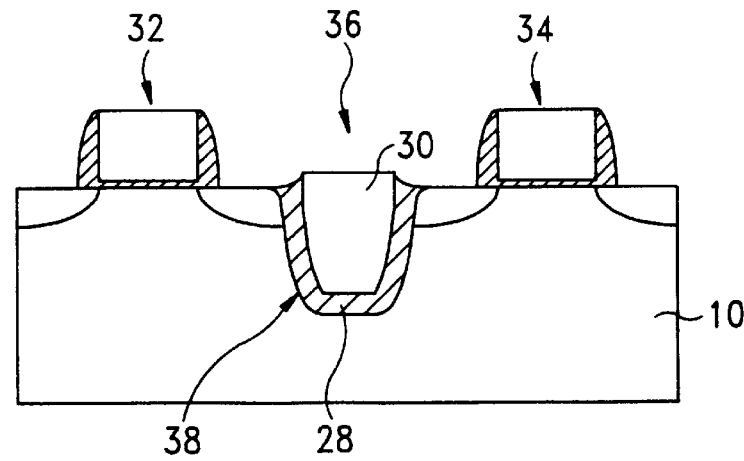
FIG. 9 illustrates a cross sectional view of removing the stacked layer and the pad layer and forming active devices in the present invention.

A portion of the second insulator layer 30 not located over the trench 26 is then removed, as shown in FIG. 8. In the case, a chemical-mechanical polishing (CMP) process or a dry etching process can be employed. Finally, the stacked layer 14 and the pad layer 12 are then removed for forming active devices like MOSFETs 32 and 34, as shown in FIG. 9. In general, an etching process is applied to form a planarized surface as shown in the figure.

A trench isolation 36 in a semiconductor substrate 10 is formed with the above identified steps. The trench isolation 36 includes a recessed region 38 in the semiconductor substrate 10. The recessed region has well rounded corners at bottom and abutting top surface of the semiconductor substrate 10. The trench isolation 36 also has a first insulator layer 28 lining the recessed region. The first insulator 28 aligns with the semiconductor substrate 10 at edge of the recessed region 38 and The first insulator 28 has inwardly increased height after the planarization process. The trench isolation 36 further includes a second insulator layer 30 filling within the recessed region 38 over the first insulator 28. The second insulator layer 30 aligns with the first insulator 28 at inner edge of the first insulator 28. The second insulator layer can also have a top plain region. As mentioned above, the first insulator layer 28 can be an oxide layer which is thermally grown from the semiconductor substrate 10 in an oxygen containing ambient. The second insulator layer 30 can be a chemical vapor deposited (CVD) oxide layer.

A stress-free shallow trench isolation is formed with the method disclosed in the present invention. As identified in the steps above, the dry etching induced damages near the active area on the semiconductor substrate 10 can be considerably reduced by the protection of the sidewall structure 24. The bird's beak and the oxidation-induced stress in conventional trench isolation process can be minimized by the formation of the buffer layer 22 as a oxidation source. The sharp trench corner can be improved by providing a well rounded trench corner. By solving the problems of the conventional trench isolation process, the method of the present invention can be used in manufacturing deep sub-micrometer CMOS or even smaller devices. The integrity of the semiconductor fabrication can be greatly increased.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a trench region in a semiconductor substrate, said method comprising the steps of:

forming a first pad layer over said semiconductor substrate;

forming a stacked layer over said first pad layer;

defining an opening to said semiconductor substrate in said first pad layer and said stacked layer;

removing a portion of said first pad layer to have an undercut region under said stacked layer around said opening;

forming a second pad layer on an exposed portion of said semiconductor substrate under said opening and said undercut region;

forming a buffer layer within said undercut region and a sidewall structure on said stacked layer;

removing a portion of said second pad layer uncovered by said sidewall structure;

removing a portion of said semiconductor substrate uncovered by said stacked layer and said second pad layer to form a trench; and forming a first insulator layer over said trench and within said undercut region.

2. The method of claim 1 and further comprising the steps of:

forming a second insulator layer within said trench and over said stacked layer;

performing a thermal process to concentrate said second insulator layer;

removing a portion of said second insulator layer not located over said trench; and removing said stacked layer and said pad layer for forming a trench isolation.

3. The method of claim 2, wherein said second insulator layer comprises a chemical vapor deposited (CVD) oxide layer.

4. The method of claim 1, wherein said first pad layer comprises an oxide layer which is grown thermally from said semiconductor substrate in an oxygen containing ambient.

5. The method of claim 1, wherein said stacked layer comprises a nitride layer which is formed by chemical vapor deposition.

6. The method of claim 1, wherein said second pad layer comprises an oxide layer which is grown thermally from said semiconductor substrate in an oxygen containing ambient, with a thickness between about 10 angstroms to about 250 angstroms.

7. The method of claim 1, wherein said buffer layer and said sidewall structure are formed by depositing and etching back a silicon layer, which is deposited within said undercut region and conformably over said stacked layer.

8. The method of claim 7, wherein said silicon layer comprises a material which is selected from the group consisting of amorphous silicon and polysilicon.

9. The method of claim 1, wherein said first insulator layer comprises an oxide layer which is thermally grown from said semiconductor substrate and said buffer layer in an oxygen containing ambient.

10. A method of forming a trench region in a semiconductor substrate, said method comprising the steps of:

forming a first pad layer over said semiconductor substrate;

forming a stacked layer over said first pad layer;

defining an opening to said semiconductor substrate in said first pad layer and said stacked layer;

removing a portion of said first pad layer to have an undercut region under said stacked layer around said opening;

forming a second pad layer on an exposed portion of said semiconductor substrate under said opening and said undercut region;

forming a buffer layer within said undercut region and a sidewall structure on said stacked layer, by depositing and etching back a silicon layer, which is deposited within said undercut region and conformably over said stacked layer;

removing a portion of said second pad layer uncovered by said sidewall structure;

removing a portion of said semiconductor substrate uncovered by said stacked layer and said second pad layer to form a trench; and forming a first insulator layer over said trench and within said undercut region, said first insulator layer being thermally grown from said semiconductor substrate and said buffer layer in an oxidization process.

11. The method of claim 10 and further comprising the steps of:

forming a second insulator layer within said trench and over said stacked layer;

performing a thermal process to concentrate said second insulator layer;

removing a portion of said second insulator layer not located over said trench; and removing said stacked layer and said pad layer to form a trench isolation.

12. The method of claim 11, wherein said second insulator layer comprises a chemical vapor deposited (CVD) oxide layer.

13. The method of claim 10, wherein said first pad layer comprises an oxide layer which is grown thermally from said semiconductor substrate in an oxygen containing ambient.

14. The method of claim 10, wherein said stacked layer comprises a nitride layer which is formed by chemical vapor deposition.

15. The method of claim 10, wherein said second pad layer comprises an oxide layer which is grown thermally from said semiconductor substrate in an oxygen containing ambient, with a thickness between about 10 angstroms to about 250 angstroms.

16. The method of claim 10, wherein said silicon layer comprises a material which is selected from the group consisting of amorphous silicon and polysilicon.

17. A method of forming a trench isolation in a semiconductor substrate, said method comprising the steps of:

forming a first pad layer over said semiconductor substrate;

forming a stacked layer over said first pad layer;

defining an opening to said semiconductor substrate in said first pad layer and said stacked layer;

removing a portion of said first pad layer to have an undercut region under said stacked layer around said opening;

forming a second pad layer on an exposed portion of said semiconductor substrate under said opening and said undercut region;

forming a buffer layer within said undercut region and a sidewall structure on said stacked layer, by depositing and etching back a silicon layer, which is deposited within said undercut region and conformably over said stacked layer;

removing a portion of said second pad layer uncovered by said sidewall structure;

removing a portion of said semiconductor substrate uncovered by said stacked layer and said second pad layer to form a trench;

forming a first insulator layer over said trench and within said undercut region, said first insulator layer being thermally grown from said semiconductor substrate and said buffer layer in an oxidization process;

forming a second insulator layer within said trench and over said stacked layer;

performing a thermal process to concentrate said second insulator layer;

removing a portion of said second insulator layer not located over said trench; and removing said stacked layer and said pad layer.

18. The method of claim 17, wherein said second insulator layer comprises a chemical vapor deposited (CVD) oxide layer.

19. The method of claim 17, wherein said first pad layer comprises an oxide layer which is grown thermally from said semiconductor substrate in an oxygen containing ambient.

20. The method of claim 17, wherein said stacked layer comprises a nitride layer which is formed by chemical vapor deposition.

21. The method of claim 17, wherein said second pad layer comprises an oxide layer which is grown thermally from said semiconductor substrate in an oxygen containing ambient, with a thickness between about 10 angstroms to about 250 angstroms.

22. The method of claim 17, wherein said silicon layer comprises a material which is selected from the group consisting of amorphous silicon and polysilicon.

* * * * *